US010937594B2

(12) United States Patent
Sounart et al.

(10) Patent No.: US 10,937,594 B2
(45) Date of Patent: Mar. 2, 2021

(54) MICROELECTRONIC DEVICES DESIGNED WITH ULTRA-HIGH-K DIELECTRIC CAPACITORS INTEGRATED WITH PACKAGE SUBSTRATES

(71) Applicant: Intel Corporation, Santa Clara, CA (US)

(72) Inventors: Thomas L. Sounart, Chandler, AZ (US); Aleksandar Aleksov, Chandler, AZ (US); Feras Eid, Chandler, AZ (US); Georgios C. Dogiamis, Chandler, AZ (US); Johanna M. Swan, Scottsdale, AZ (US); Kristof Darmawikarta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/606,130

(22) PCT Filed: Jun. 27, 2017

(86) PCT No.: PCT/US2017/039598
§ 371 (c)(1),
(2) Date: Oct. 17, 2019

(87) PCT Pub. No.: WO2019/005021
PCT Pub. Date: Jan. 3, 2019

(65) Prior Publication Data
US 2020/0051743 A1 Feb. 13, 2020

(51) Int. Cl.
*H01G 4/14* (2006.01)
*H05K 1/02* (2006.01)
*H05K 1/03* (2006.01)

(52) U.S. Cl.
CPC .............. *H01G 4/14* (2013.01); *H05K 1/0201* (2013.01); *H05K 1/0231* (2013.01); *H05K 1/0313* (2013.01)

(58) Field of Classification Search
CPC ... H01G 4/14; H01G 4/18; H01G 4/33; H01L 23/49822; H01L 23/3128;
(Continued)

(56) References Cited

U.S. PATENT DOCUMENTS 10,251,272 B2 * 4/2019 Aleksov ............ H01L 23/49838
2004/0087058 A1 5/2004 Ooi et al.
(Continued)

OTHER PUBLICATIONS

High-permittivity polymer—matrix-composites_Dang et al._660-723_Aug. 2011.*
(Continued)

*Primary Examiner* — Timothy J Thompson
*Assistant Examiner* — Guillermo J Egoavil
(74) *Attorney, Agent, or Firm* — Schwabe, Williamson & Wyatt, P.C.

(57) ABSTRACT

Embodiments of the invention include a microelectronic device that includes a plurality of organic dielectric layers and a capacitor formed in-situ with at least one organic dielectric layer of the plurality of organic dielectric layers. The capacitor includes first and second conductive electrodes and an ultra-high-k dielectric layer that is positioned between the first and second conductive electrodes.

19 Claims, 10 Drawing Sheets

(58) Field of Classification Search
CPC . H01L 2224/16225; H01L 2224/16227; H01L 2224/16235; H01L 2924/181; H01L 2924/00012; H01L 2924/15313; H05K 1/0201; H05K 1/0231; H05K 1/0313; H05K 1/02; H05K 1/03; H05K 1/162; H05K 2201/015; H05K 2201/0187; H05K 2201/0209; H05K 2201/09481; H05K 2201/10674; H05K 2203/0568; H05K 2203/121; H05K 3/108; H05K 3/429; Y10T 428/24802
USPC .......................... 174/260; 428/195.1; 427/80
See application file for complete search history.

(56) References Cited

U.S. PATENT DOCUMENTS

| | | | |
|---|---|---|---|
| 2004/0256731 A1 | 12/2004 | Mao et al. | |
| 2006/0215380 A1 | 9/2006 | Lu et al. | |
| 2007/0275525 A1 | 11/2007 | Das et al. | |
| 2008/0145622 A1* | 6/2008 | Roy | H01G 4/33 428/195.1 |
| 2012/0326272 A1* | 12/2012 | Rokuhara | H01G 4/228 257/532 |
| 2015/0043126 A1* | 2/2015 | Hurwitz | H01G 4/224 361/303 |
| 2016/0126239 A1* | 5/2016 | Singh | H01L 28/20 257/532 |
| 2018/0269164 A1* | 9/2018 | Lin | H01L 25/0655 |

OTHER PUBLICATIONS

International Search Report and Written Opinion for International Patent Application No. PCT/US2017/039598 dated Feb. 26, 2018, 14 pgs.
International Preliminary Report on Patentability for International Patent Application No. PCT/US2017/039598, dated Jan. 9, 2020, 11 pages.

* cited by examiner

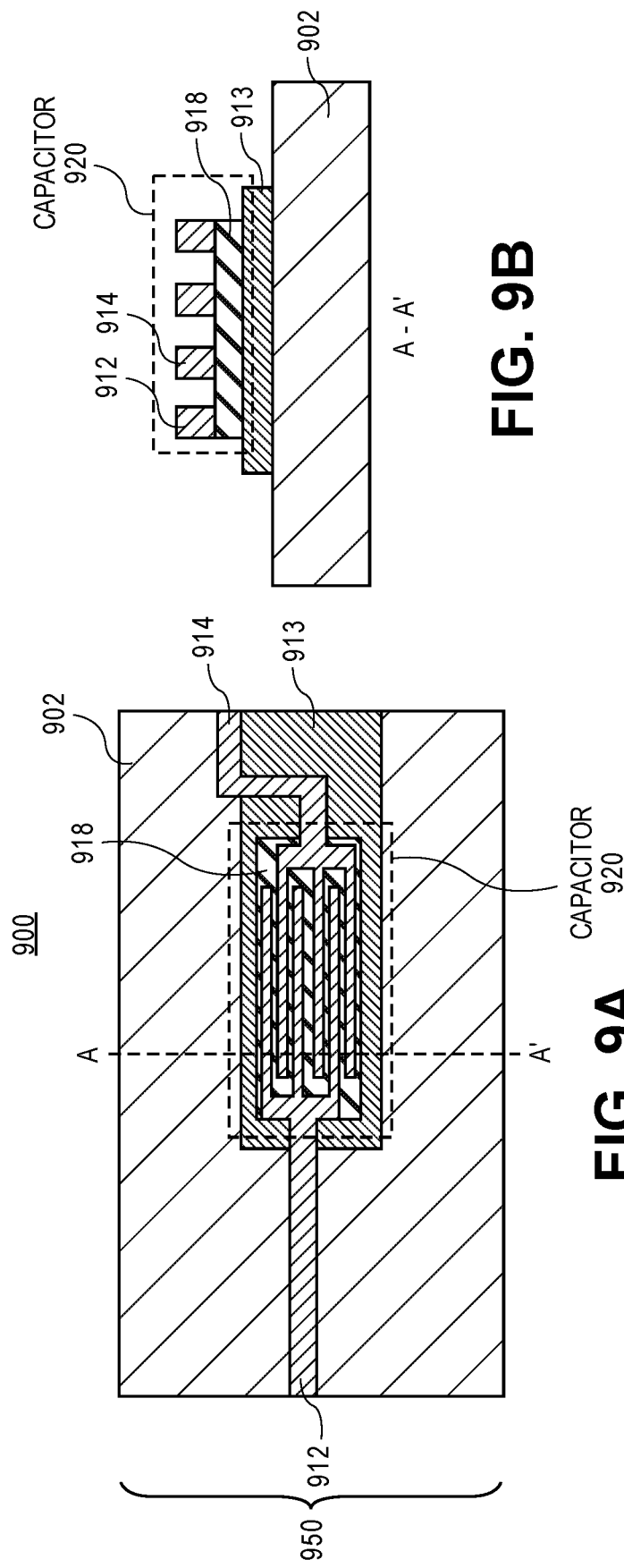

MICROELECTRONIC DEVICES DESIGNED WITH ULTRA-HIGH-K DIELECTRIC CAPACITORS INTEGRATED WITH PACKAGE SUBSTRATES

CROSS-REFERENCE TO RELATED APPLICATION

This patent application is a U.S. National Phase Application under 35 U.S.C. § 371 of International Application No. PCT/US2017/039598, filed Jun. 27, 2017, entitled "MICROELECTRONIC DEVICES DESIGNED WITH ULTRA-HIGH-K DIELECTRIC CAPACITORS INTEGRATED WITH PACKAGE SUBSTRATES," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices that are designed with ultra-high-k dielectric capacitors integrated with package substrates.

BACKGROUND OF THE INVENTION

Small form factor electronic systems are needed for internet of things devices (IOT), mobile devices, wearables, and autonomous vehicles. Since package area is limited in these systems, capacitors for power delivery require high capacitance densities (e.g., 10-10,000 nF/mm2), which requires ultra-high-k dielectric materials with relative permittivity of approximately 1000-10,000. The dielectric materials used typically require annealing, sintering, or deposition at greater than 500 degrees C. These ultra-high-k dielectric materials are therefore deposited on rigid, high temperature substrates, and separately packaged and assembled on organic electronic packages. This increases Z-height and adds assembly operations, which adds process time and cost, and becomes particularly challenging as these discrete components are miniaturized to sub-millimeter length scales and when many capacitors are required. Furthermore, discrete capacitors typically occupy a large area on a land side of the package (i.e., the side opposing the silicon), reducing the land-side area available for bumps or lands.

BRIEF DESCRIPTION OF THE DRAWINGS

FIG. 9A illustrates a top view of a microelectronic device having a package substrate with an integrated ultra-high-k capacitor that is designed with an interdigitated configuration in accordance with one embodiment.

FIG. 9B illustrates a view AA' of the microelectronic device 900 having a package substrate with a package integrated ultra-high-k capacitor that is designed with an interdigitated configuration in accordance with one embodiment.

DETAILED DESCRIPTION OF THE INVENTION

Figure 1:
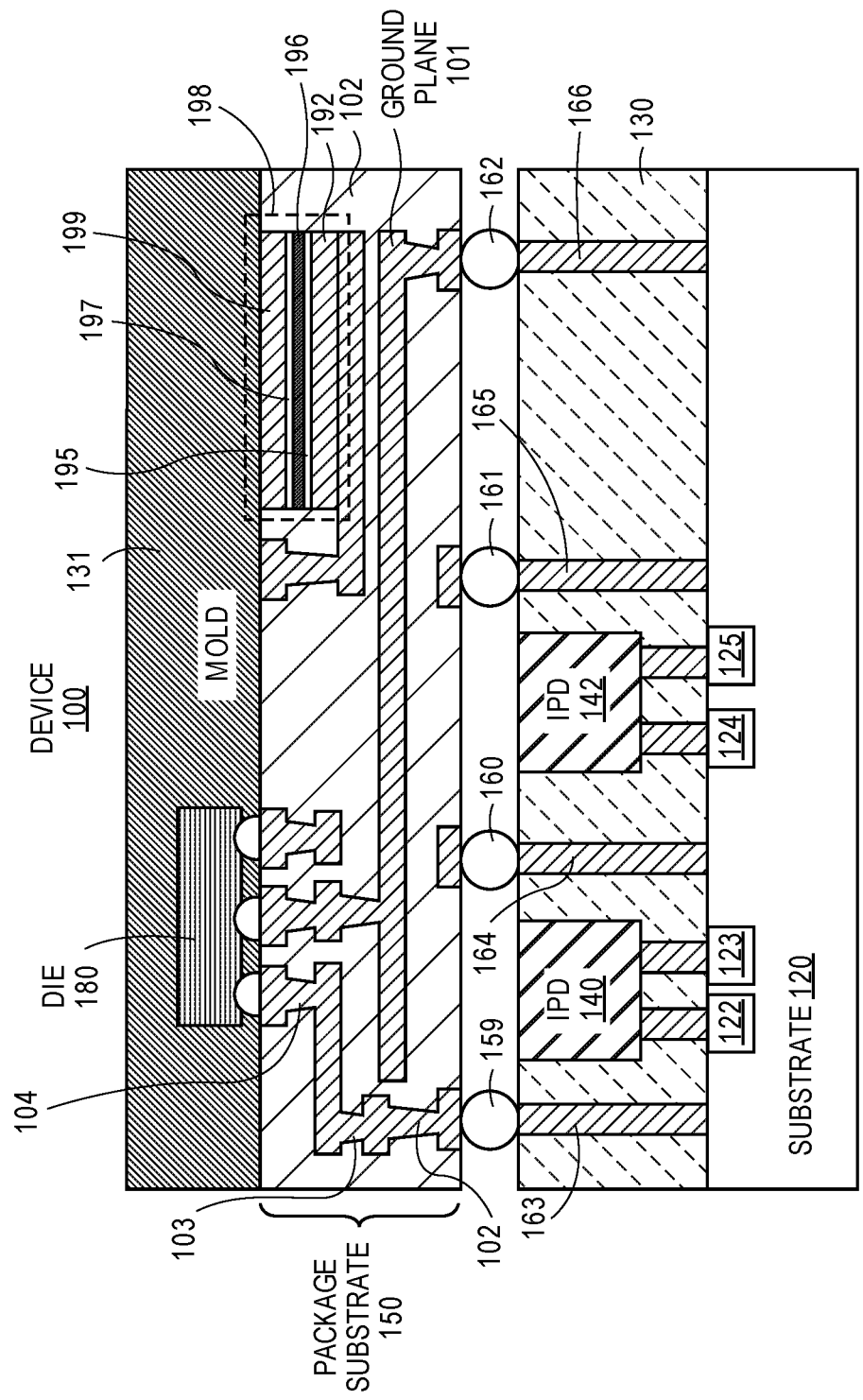
FIG. 1 illustrates a microelectronic device having a package integrated ultra-high-k capacitor and substrate in accordance with one embodiment.

Described herein are microelectronic devices that are designed with ultra-high-k dielectric capacitors integrated with package substrates. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order to not obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

The present design includes an ultra-high-k dielectric capacitor that is fabricated directly in-situ on a low-temperature organic substrate or in a low-temperature organic substrate to form a package-integrated capacitor with low Z-height and no assembly required. The capacitor fabrication can also be integrated into the existing package substrate layers, thus freeing up land-side area for input output (JO) and power bumps, and minimizing or eliminating Z-height entirely for the integrated capacitor.

The present design utilizes thin films of crystalline ultra-high-k dielectric material (e.g., ferroelectric material, ferroelectric perovskite, lead zirconate titanate (PZT), barium strontium titanate (BST), barium titanate (BTO), sodium potassium niobate (KNN), etc.), that is deposited on one or more of the layers in an organic package substrate to act as the dielectric layer of a substrate-integrated capacitor. The deposition is carried out at substrate-compatible temperatures, using, for example, pulsed laser anneal to crystallize the dielectric film while keeping the substrate at low temperatures (e.g., less than 215 degrees C. in some embodiments) to prevent damaging the organic layers. In other embodiments, depending on material selection, the temperature range can be greater than 215 degrees C. After patterning the capacitor dielectric thin film, an electrode layer is deposited and patterned.

Currently, the thinnest discrete capacitors for power delivery add at least 200 um of Z-height to a package substrate. In the present design, the capacitors are embedded in the layers of the package substrate, thus adding no Z-height to the package substrate. Even if deposited on the package substrate, the Z-height of the capacitors would be only 1 to 10 um. In either case, the present design enables significantly reduced package thickness.

Discrete capacitors require several assembly steps to attach them to the substrate, including flux deposition, individual component pick and place, mass reflow, and optionally deflux to remove any flux residue. These assembly steps add process time and cost. Pick and place of capacitors is a serial process of many capacitors on each die, and this becomes increasingly expensive and difficult as capacitors are scaled down to sub-millimeter dimensions. In the present design, these assembly steps may be eliminated. The capacitor is manufactured as part of the substrate fabrication.

Conventional discrete capacitors occupy large areas of the land-side of the package. In the present design, the capacitors can be fabricated within the layers of the substrate, therefore reducing or eliminating the discrete power-delivery capacitors on the land-side, providing more area for lands/bumps, and ultimately reducing the package x-y form-factor.

FIG. 1 illustrates a microelectronic device having a package integrated ultra-high-k capacitor and substrate in accordance with one embodiment. The microelectronic device 100 includes an optional substrate 120 and a package substrate 150 having at least one ultra-high-k capacitor 198. The package substrate 150 includes at least integrated ultra-high-k capacitor 198, conductive layers (e.g., 101, 103,104), and dielectric material 102 (e.g., organic material, low temperature co-fired ceramic materials, liquid crystal polymers, etc.). The capacitor 198 includes conductive electrodes 192 and 199, seed layers 195 and 197, and ultra-high-k dielectric layer 196 that is disposed between the optional seed layers.

The components 122-125 of the substrate 120 and IPDs (Integrated Passive Devices) 140 and 142 can communicate with components of the substrate 150 or other components not shown in FIG. 1 using connections 163-166 and solder balls 159-162. The IPDs may include any type of passives including inductors, transformers, capacitors, and resistors. In one example, capacitors on the IPD may be used for power delivery. In another example, resistors on the same or a different IPD may be used for digital signal equalization. In another example, the substrate 120 is a printed circuit board.

The capacitor 198 can be created in-situ during substrate manufacturing as part of the build up layers of the substrate 150. The capacitor 198 can also be coupled to the die 180.

The optional mold 131 provides protection and stability for the die 180 and the substrate 150. In some embodiments, the mold material may be formed such that the backside of the die is exposed.

Figure 2:
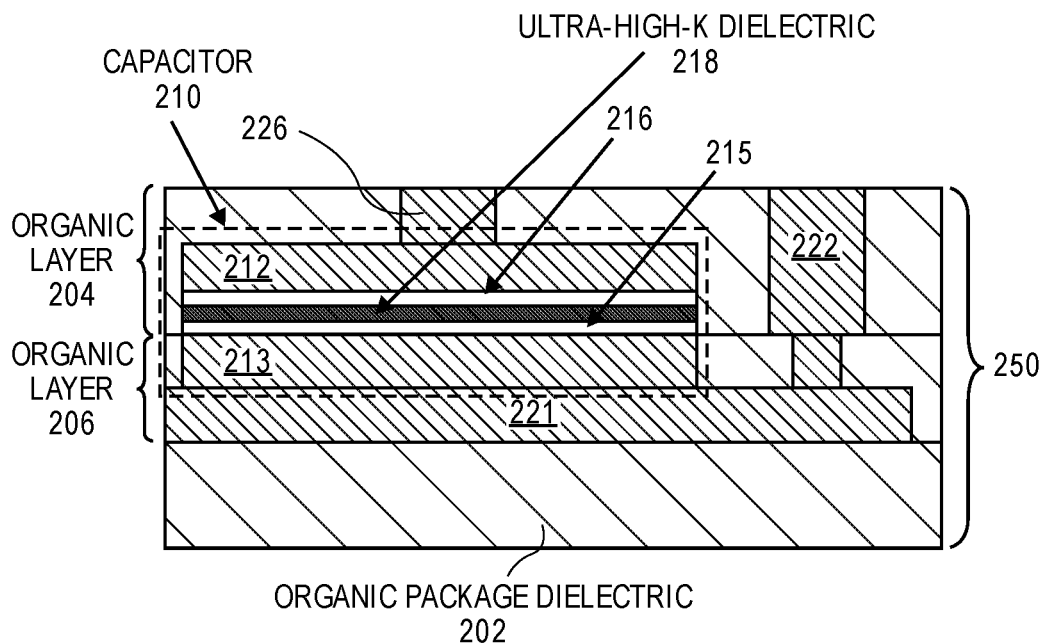
FIG. 2 illustrates a microelectronic device having a package substrate with a package integrated ultra-high-k capacitor in accordance with one embodiment.
Figure 3:
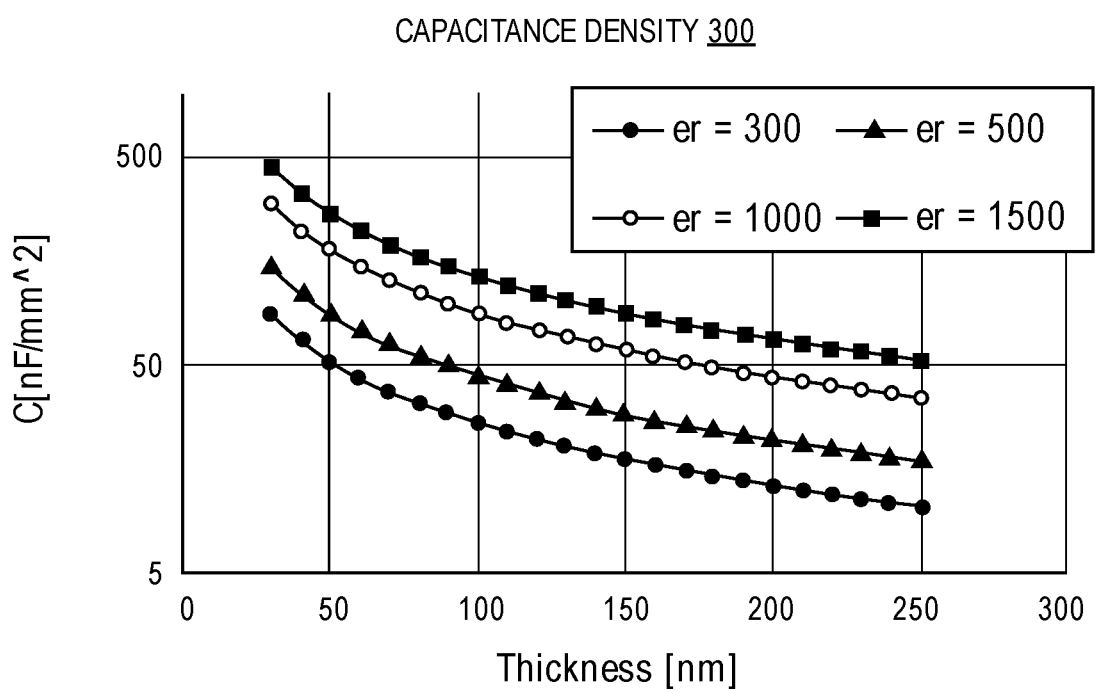
FIG. 3 illustrates a diagram for capacitance density versus thickness of a dielectric layer of a capacitor in accordance with one embodiment.

FIG. 2 illustrates a microelectronic device having a package substrate with a package integrated ultra-high-k capacitor in accordance with one embodiment. The microelectronic device 200 includes a package substrate 250 having at least one ultra-high-k capacitor 210, dielectric material 202 (e.g., organic material, low temperature co-fired ceramic materials, liquid crystal polymers, etc.) that includes organic layers 204 and 206, and different levels of conductive layers and connections 220-222. The ultra-high-k capacitor 210 includes conductive electrodes 212 and 213, optional seed layers 215 and 216, and an ultra-high-k dielectric layer 218. The parallel-plate capacitor 210 is embedded in the organic package substrate 250 and electrically routed with the standard conductive layers and connections in the package substrate. The ultra-high-k dielectric layer 218 (e.g., ferroelectric material, ferroelectric perovskite, lead zirconate titanate (PZT), barium strontium titanate (BST), barium titanate (BTO), sodium potassium niobate (KNN), etc.) can be any material with permittivity high enough to achieve a capacitance density in the range of 10-10,000 $nF/mm^2$. The ultra-high-k dielectric layer can be deposited directly on a metal layer (e.g., Copper) of the package substrate or on a conductive seed layer of another material as shown in FIG. 2. The seed layer (e.g., seed layers 215 and 216) can be another metallic electrode material (e.g., Nickel, Platinum, Gold, Palladium) or a conductive oxide (e.g., $RuO_2$, $LaNiO_3$) or any other material. The seed layer shown does not need to be a single layer or material. The seed layer could be multiple layers of different materials (e.g., thermal buffer layer), some of which are not necessarily conductive. The seed layer(s) may also be deposited on the top of the ultra-high-k dielectric layer as shown in FIG. 2, or this layer may be omitted. The seed layer may be an inert layer that does not react with the ultra-high-k dielectric layer. An optional lower seed layer 215 that is below the ultra-high-k dielectric layer may also provide a crystal orientation template for an improved crystal orientation of the ultra-high-k dielectric layer and thus an increased dielectric constant k for the dielectric layer 218. The thickness of the ultra-high-k dielectric layer can range from about 30 nanometers (nm) to 1000 nm, while the relative permittivity will range from at least 200 up to as high as 10,000, but typically will be in the range of 1000 to 5000. FIG. 3 illustrates a diagram for capacitance density versus thickness of a dielectric layer of a capacitor in accordance with one embodiment. A vertical axis 320 has a capacitance density in units of nF/mm2 and a horizontal axis 310 has a thickness in units of nanometers. Different selected values of k (i.e., relative permittivity, er, at 300, 500, 1000, 1500) are plotted on the diagram 300 to show an increase in capacitance density for higher values of k and lower thicknesses of the ultra-high-k dielectric layer.

Figure 4:
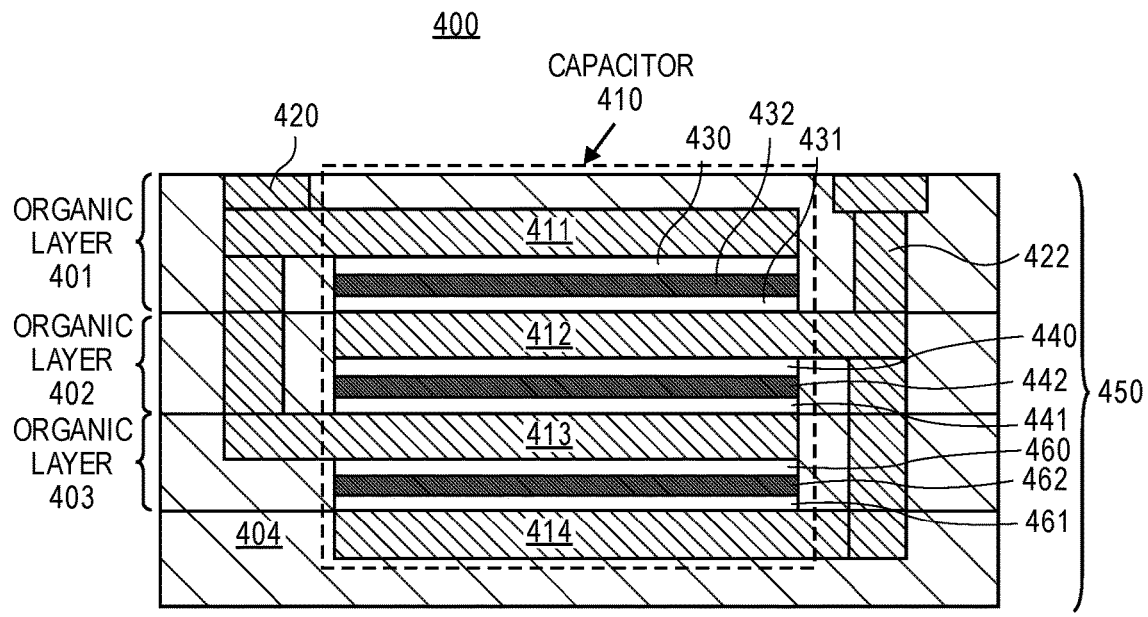
FIG. 4 illustrates a microelectronic device having a package substrate with a package integrated ultra-high-k capacitor in accordance with one embodiment.

FIG. 4 illustrates a microelectronic device having a package substrate with a package integrated ultra-ultra-high-k capacitor in accordance with one embodiment. The microelectronic device 400 includes a package substrate 450 having at least one ultra-high-k capacitor 410, dielectric material 404 (e.g., organic material, low temperature co-fired ceramic materials, liquid crystal polymers, etc.) that includes organic layers 401-403, and different levels of conductive layers and connections 420 and 422. The multi-layer ultra-high-k capacitor 410 includes conductive electrodes 411-414, optional seed layers 430, 431, 440, 441, 460, 461, and ultra-high-k dielectric layers 432, 442, and 462.

The parallel-plate capacitor 410 is embedded in the organic package substrate 450 and electrically routed with the standard conductive layers and connections in the package substrate. The ultra-high-k dielectric layers (e.g., ferroelectric material, ferroelectric perovskite, lead zirconate titanate (PZT), barium strontium titanate (BST), barium titanate (BTO), sodium potassium niobate (KNN), etc.) can be any material with permittivity high enough to achieve a capacitance density in the range of 10-10,000 $nF/mm^2$. The ultra-high-k dielectric layers can be deposited directly on a metal layer (e.g., Copper) of the package substrate or on a conductive seed layer of another material as shown in FIG. 4. The seed layers can be another metallic electrode material (e.g., Nickel, Platinum, Gold, Palladium) or a conductive oxide (e.g., $RuO_2$, $LaNiO_3$) or any other material. The seed layers shown do not need to be a single layer or material. The seed layers could be multiple layers of different materials, some of which are not necessarily conductive. The seed layer(s) may also be deposited on the top of the dielectric layers as shown in FIG. 4, or this layer may be omitted. The thickness of the ultra-high-k dielectric layer can range from about 30 nanometers (nm) to 1000 nm, while the relative permittivity will range from at least 200 up to as high as 10,000, but typically will be in the range of 1000 to 5000.

An ultra-high-k dielectric layer can be fabricated in each package substrate layer, as shown in FIG. 4. This forms a multi-layer stacked capacitor 410, whose layers are connected in parallel to increase the capacitance density to n*C, where n is the number of layers and C is the capacitance density of each layer. Note that FIG. 4 shows three dielectric layers, but the number of layers can be more or less than this, and limited only by the number of package substrate layers.

Figure 5:
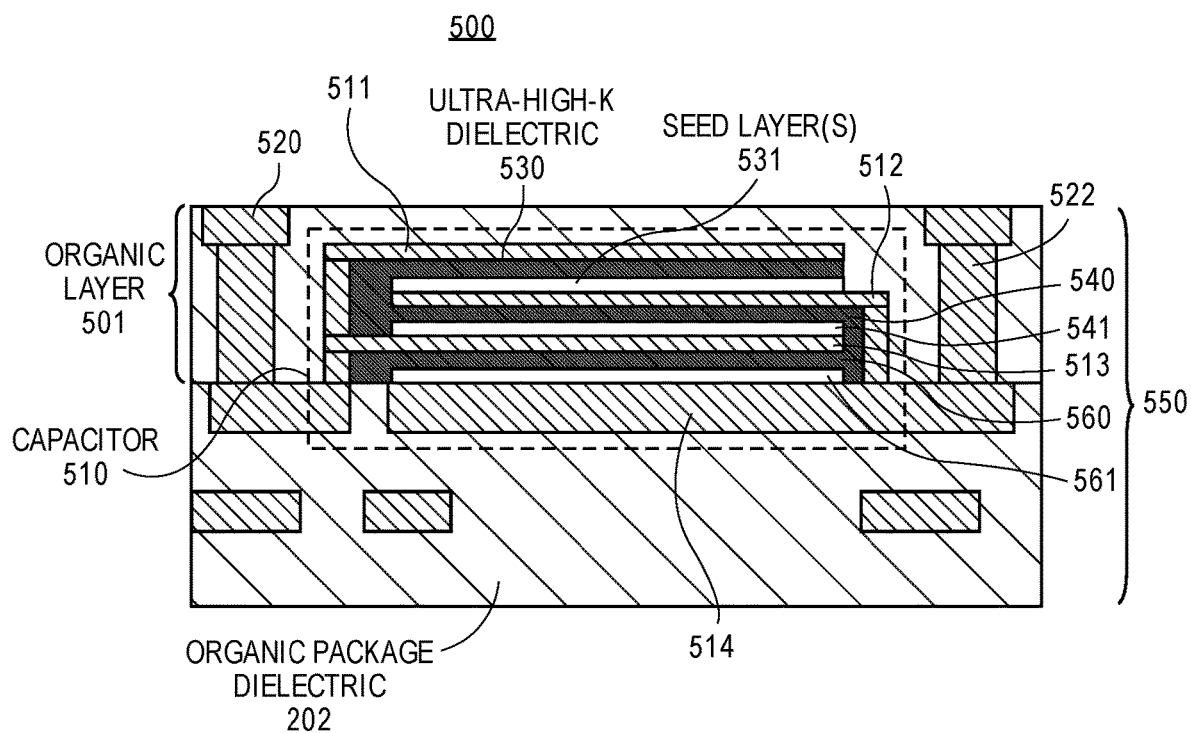
FIG. 5 illustrates a microelectronic device having a package substrate with a package integrated ultra-high-k capacitor having electrodes formed in a single organic layer of the package substrate in accordance with one embodiment.

FIG. 5 illustrates a microelectronic device having a package substrate with a package integrated ultra-high-k capacitor having electrodes formed in a single organic layer of the package substrate in accordance with one embodiment. The microelectronic device 500 includes a package substrate 550 having at least one ultra-high-k capacitor 510, dielectric material 502 (e.g., organic material, low temperature co-fired ceramic materials, liquid crystal polymers, etc.) that includes at least organic layer 501, and different levels of conductive layers and connections 520 and 522. The ultra-high-k capacitor 510 includes conductive electrodes 511-514, optional seed layers 531, 541, 561, and ultra-high-k dielectric layers 530, 540, and 560. The parallel-plate capacitor 510 is embedded within the organic package substrate 550 and electrically routed with the standard conductive layers and connections in the package substrate. The ultra-high-k dielectric layers (e.g., ferroelectric material, ferroelectric perovskite, lead zirconate titanate (PZT), barium strontium titanate (BST), barium titanate (BTO), sodium potassium niobate (KNN), etc.) can be any material with permittivity high enough to achieve a capacitance density in the range of 10-10,000 $nF/mm^2$. The ultra-high-k dielectric layers can be deposited directly on a metal layer (e.g., Copper) of the package substrate or on a conductive seed layer of another material as shown in FIG. 5. The seed layers can be another metallic electrode material (e.g., Nickel, Platinum, Gold, Palladium) or a conductive oxide (e.g., $RuO_2$, $LaNiO_3$) or any other material. The seed layers shown do not need to be a single layer or material. The seed layers could be multiple layers of different materials, some of which are not necessarily conductive. The seed layer(s) may also be deposited on the top of the dielectric layers, or this layer may be omitted, as shown in FIG. 5.

The multilayer capacitor 510 is formed within one organic layer 501. This enables more capacitor layers stacked in parallel for even higher capacitance densities while occupying only a single layer in the package substrate. Note that FIG. 5 shows 3 dielectric layers, but there can be more or less dielectric layers for a capacitor. FIG. 5 also shows the embodiment with a seed layer only on the bottom of the capacitor dielectric layer. However, the seed layer could be on the top also, or with no seed layers, as is true for all the embodiments shown herein.

Figure 6:
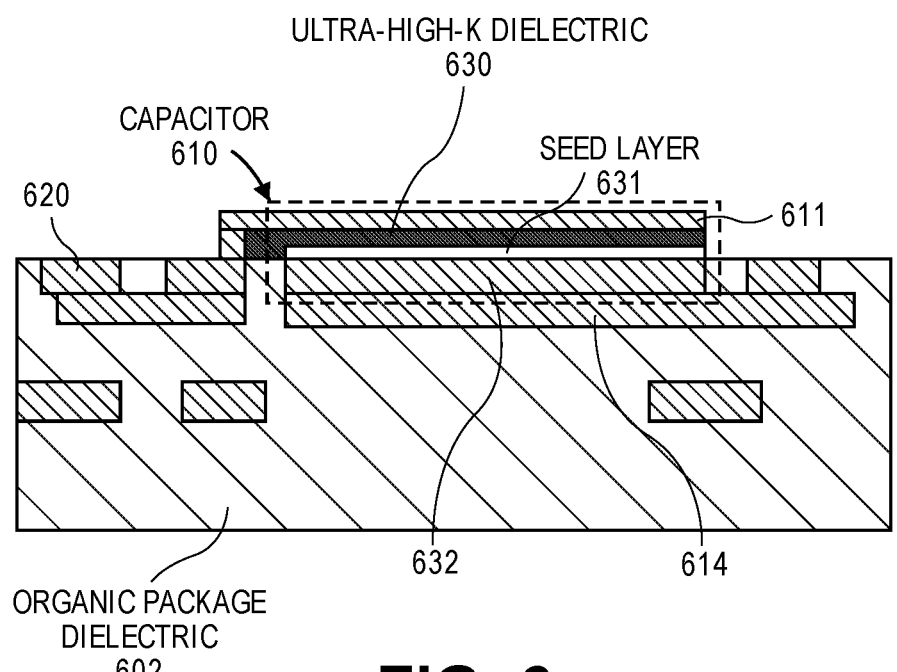
FIG. 6 illustrates a microelectronic device having a package substrate with an ultra-high-k capacitor having electrodes formed on the package substrate in accordance with one embodiment.

FIG. 6 illustrates a microelectronic device having a package substrate with an ultra-high-k capacitor having electrodes formed on the package substrate in accordance with one embodiment. The microelectronic device 600 includes a package substrate 650 having at least one ultra-high-k capacitor 610, dielectric material 602 (e.g., organic material, low temperature co-fired ceramic materials, liquid crystal polymers, etc.), and different levels of conductive layers and connections 620 and 614. The ultra-high-k capacitor 610 includes conductive electrodes 611 and 632, optional seed layer 631, and ultra-high-k dielectric layer 630. The parallel-plate capacitor 610 is formed directly on the organic package substrate 650 and electrically routed with the standard conductive layers and connections in the package substrate. The ultra-high-k dielectric layer (e.g., ferroelectric material, ferroelectric perovskite, lead zirconate titanate (PZT), barium strontium titanate (BST), barium titanate (BTO), sodium potassium niobate (KNN), etc.) can be any material with permittivity high enough to achieve a capacitance density in the range of 10-10,000 $nF/mm^2$. The ultra-high-k dielectric layer can be deposited directly on a metal layer (e.g., Copper) of the package substrate or on a conductive seed layer of another material as shown in FIG. 6. The seed layer can be another metallic electrode material (e.g., Nickel, Platinum, Gold, Palladium) or a conductive oxide (e.g., $RuO_2$, $LaNiO_3$) or any other material. The seed layer shown does not need to be a single layer or material. The seed layer could be multiple layers of different materials, some of which are not necessarily conducting The capacitor 610 is shown as one layer, but the capacitor can be multiple layers in the same way as a multilayer capacitor is fabricated within one of the substrate layers as shown in FIG. 5. FIG. 6 also shows the embodiment with a seed layer only on the bottom of the capacitor dielectric layer. However, the seed layer could be on the top also, or with no seed layers, as is true for all the embodiments shown herein.

FIGS. 7A-7J illustrate a process for fabricating a package-integrated ultra-high-k capacitor that is embedded within an organic substrate in accordance with one embodiment. A microelectronic device 700 includes a package substrate 750 having conductive layers 722 and 734, and dielectric material 702 (e.g., organic material, low temperature co-fired ceramic materials, liquid crystal polymers, etc.). A capacitor electrode layer 734 is deposited and patterned in FIG. 7A. An organic dielectric layer lamination and polish operations occur to form the device 770 in FIG. 7B. Next, the process continues with a first seed layer 733 being sputtered on an upper surface of the device 770 to form the device 771 in FIG. 7C. Then, the process continues with an ultra-high-k dielectric layer 732 being sputtered on the seed layer to form the device 772 in FIG. 7D. Subsequently, the process continues with a crystallization (e.g., laser anneal) of the ultra-high-k dielectric layer 732 in capacitor electrode regions to form the device 773 in FIG. 7E. Next, the process continues with a second seed layer 731 and a conductive layer 730 being sputtered on an upper surface of the layer 732 to form the device 774 in FIG. 7F.

Figure 7A:
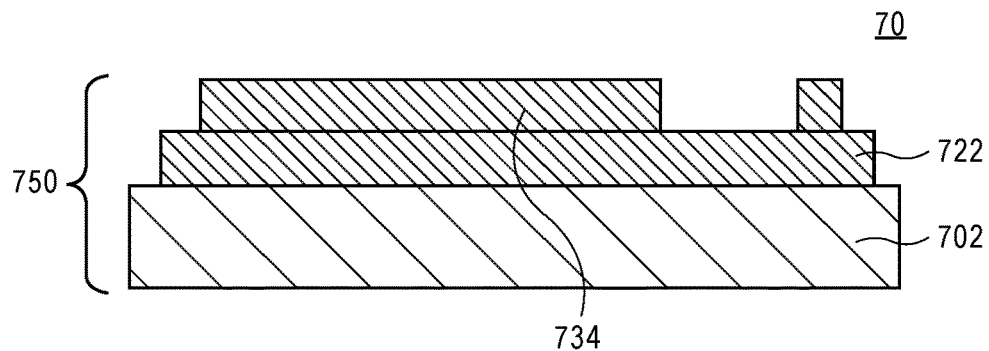
FIGS. 7A-7J illustrate a process for fabricating a package-integrated ultra-high-k capacitor that is embedded within an organic substrate in accordance with one embodiment.
Figure 7B:
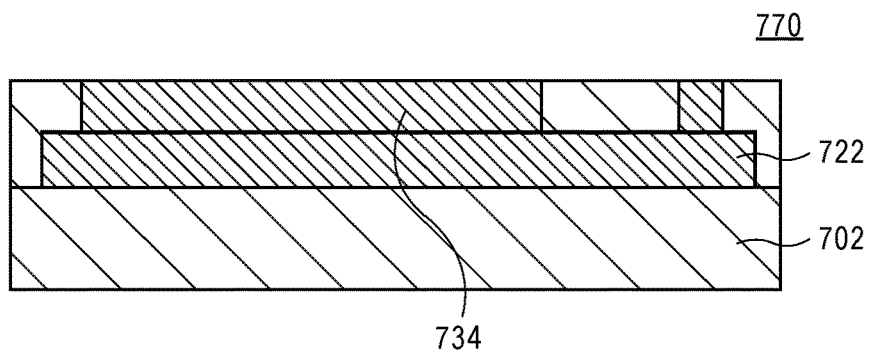
Figure 7C:
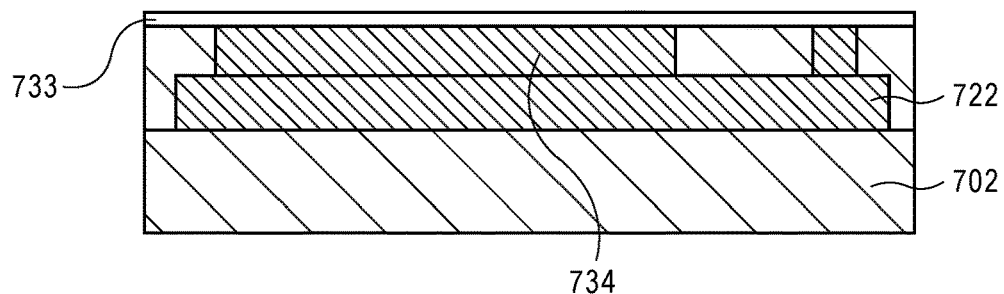
Figure 7D:
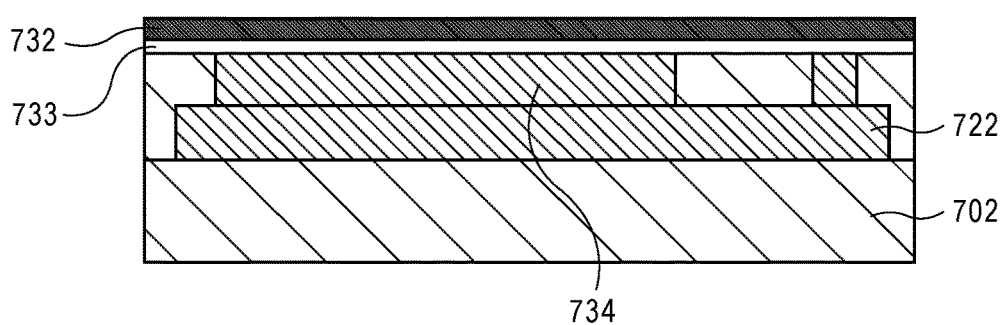
Figure 7E:
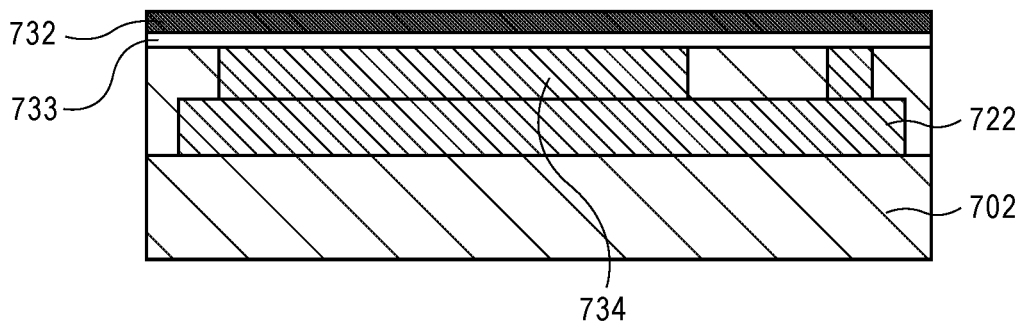
Figure 7F:
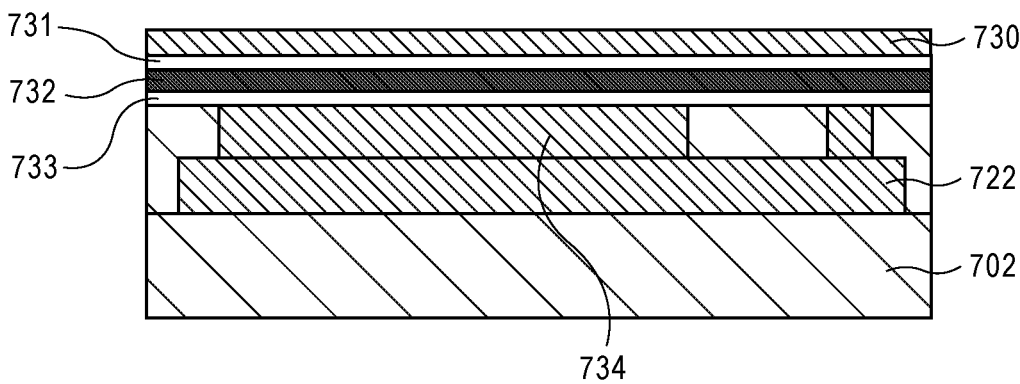
Figure 7G:
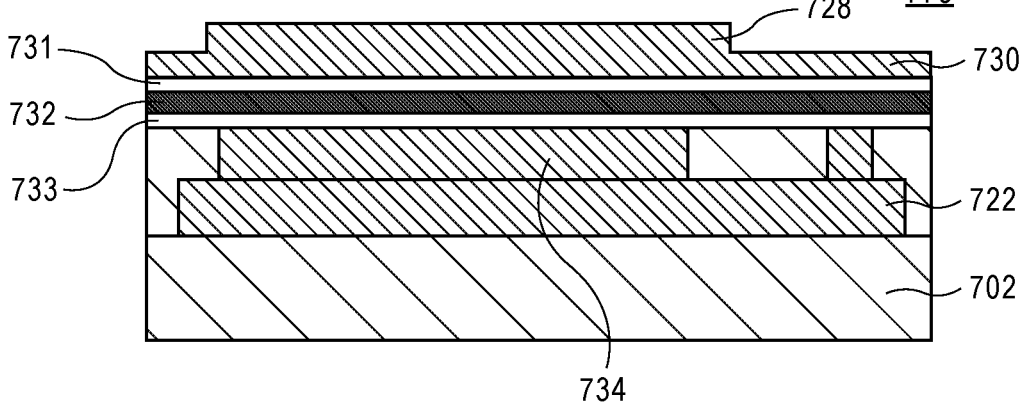

Next, the process continues with a lithographic operation and plating of a conductive layer to form an electrode 728 of the device 775 in FIG. 7G. The process continues with the plated electrode 728 being patterned and acting as a hard mask for etching seed layer 731, ultra-high-k dielectric layer 732, and seed layer 733 to form device 776 in FIG. 7H.

Figure 7H:
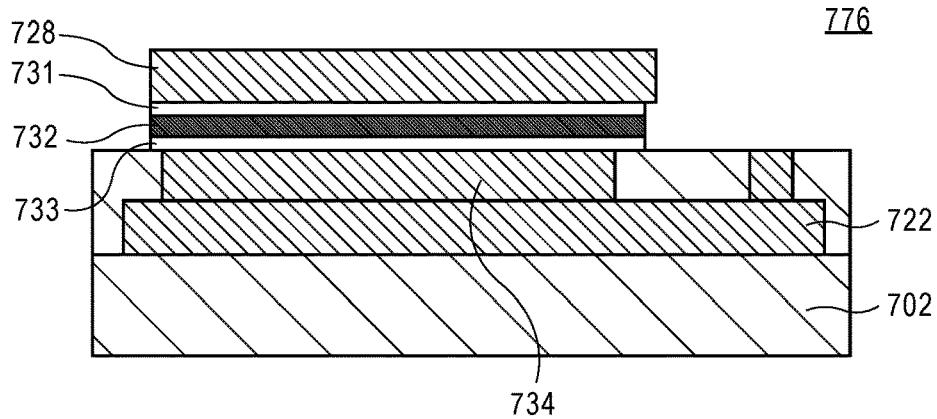
Figure 7I:
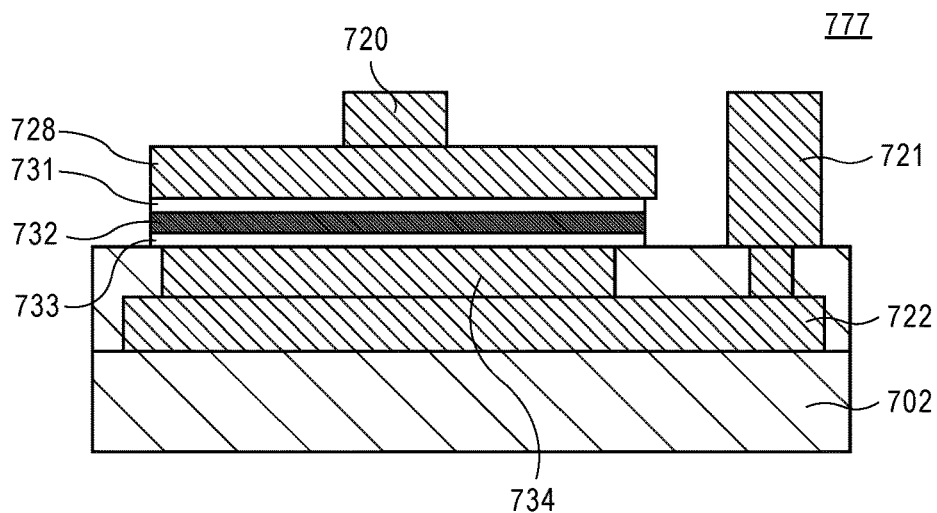

In one example, the process continues with the formation of a conductive layer and lithography to form conductive connections 720 and 721 as illustrated in device 777 of FIG. 7I. An organic dielectric layer lamination and polish operations occur to form the device 778 in FIG. 7J.

Figure 7J:
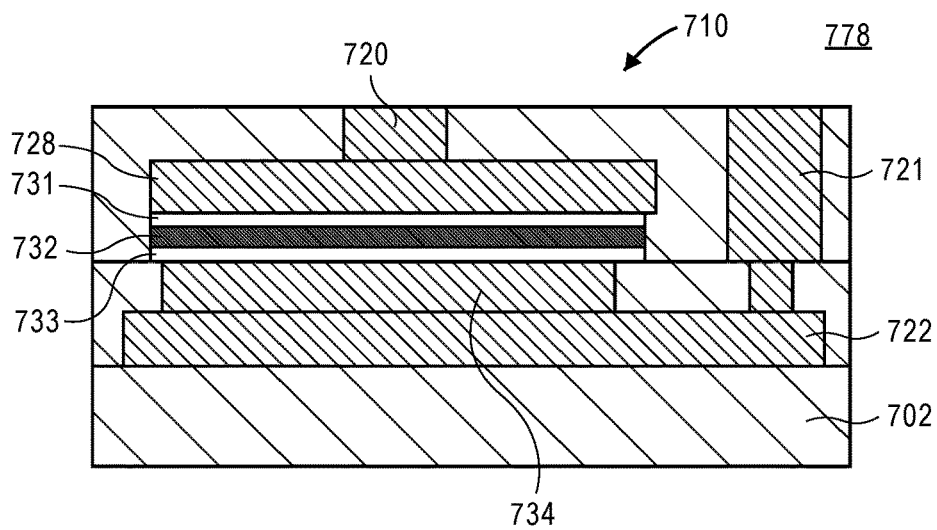

In another example, this last part of the flow as illustrated in FIGS. 7I and 7J (especially for a single layer/non-stacked) capacitor can be done with a more standard packaging flow. In particular, after FIG. 7H is finished the next operation would be dielectric/buildup-film lamination and then via drill using a laser operation to contact to the capacitor electrodes and then creation of the next metal layer including via/contact formation.

Fabrication of multiple dielectric layers repeats the process flow operations for each layer. The deposition of the ultra-high-k dielectric layers is carried out at organic substrate-compatible temperatures, using, for example, pulsed laser anneal to crystallize the dielectric film while keeping the organic substrate at a low temperature (e.g., less than 215 degrees C. in some embodiments) to prevent damaging the organic layers. In other embodiments, depending on material selection, the temperature range can be greater than 215 degrees C. The laser pulse time is shorter than the thermal diffusion time in the dielectric thin film and potentially other layers, which keeps the absorbed laser energy localized in the dielectric layer of the capacitor (e.g., perovskite dielectric layer) during the pulse timescale. Then thermal diffusion dissipates the energy without significant heating of the substrate. Rapidly repeated laser pulses provide enough time at crystallization temperature to grow or deposit a crystalline ultra-high-k dielectric film.

The capacitor layers do not have to be planar as shown in FIGS. 1-7J. They can be fabricated with a corrugated or 3D trench structure to provide more surface area in one layer as shown in FIG. 8 in accordance with one embodiment. This increases the surface area of the electrodes, and therefore the capacitance density, by up to 3× for a 1:1 aspect ratio, or higher for deeper aspect ratio trenches. The sidewalls are not limited to vertical as shown in FIG. 8. The sidewalls can be any angle. A tapered sidewall improves the manufacturability with a tradeoff of less capacitance density.

Figure 8A:
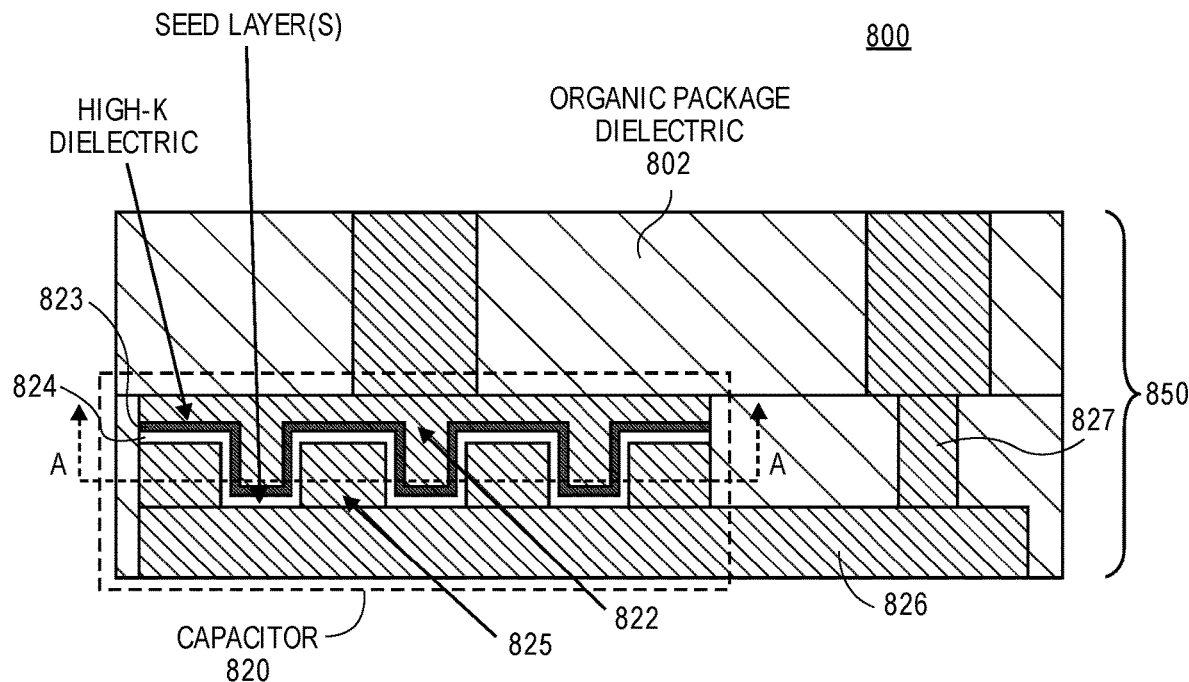
FIG. 8A illustrates a cross-sectional view of a microelectronic device having a package substrate with a package integrated ultra-high-k corrugated capacitor having electrodes formed in a single organic layer of the package substrate in accordance with one embodiment.
Figure 8B:
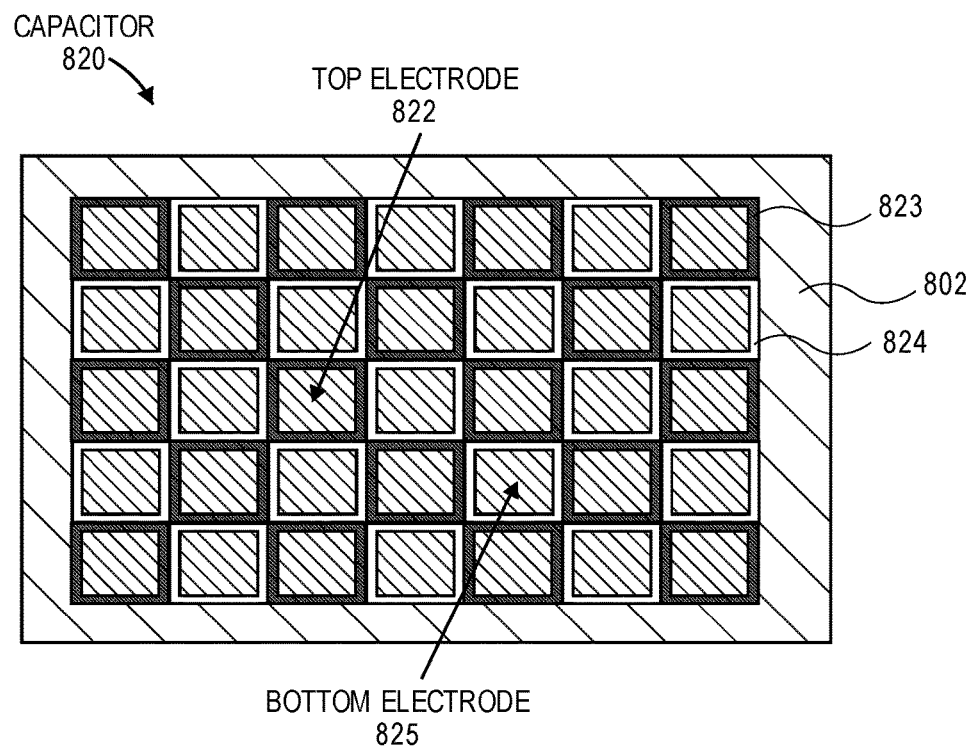
FIG. 8B illustrates a view AA of the microelectronic device 800 having a package substrate with a package integrated ultra-high-k corrugated capacitor having electrodes formed in a single organic layer of the package substrate in accordance with one embodiment.

FIG. 8A illustrates a cross-sectional view of a microelectronic device having a package substrate with a package integrated ultra-ultra-high-k corrugated capacitor having electrodes formed in a single organic layer of the package substrate in accordance with one embodiment. The microelectronic device 800 includes a package substrate 850 having at least one ultra-high-k capacitor 820, dielectric material 802 (e.g., organic material, low temperature co-fired ceramic materials, liquid crystal polymers, etc.), and different levels of conductive layers and connections 821, 826, and 827. The ultra-high-k capacitor 820 includes conductive corrugated electrodes 822 and 825, optional seed layer 824, and ultra-high-k dielectric layer 823. The parallel-plate corrugated capacitor 820 is embedded within the organic package substrate 850 and electrically routed with the standard conductive layers and connections in the package substrate. The ultra-high-k dielectric layers (e.g., ferroelectric material, ferroelectric perovskite, lead zirconate titanate (PZT), barium strontium titanate (BST), barium titanate (BTO), sodium potassium niobate (KNN), etc.) can be any material with permittivity high enough to achieve a capacitance density in the range of 10-10,000 nF/mm$^2$. The ultra-high-k dielectric layers can be deposited directly on a metal layer (e.g., Copper) of the package substrate or on a conductive seed layer of another material as shown in FIG. 8. The seed layer can be another metallic electrode material (e.g., Nickel, Platinum, Gold, Palladium) or a conductive oxide (e.g., $RuO_2$, $LaNiO_3$) or any other material. The seed layer shown does not need to be a single layer or material. The seed layer could be multiple layers of different materials, some of which are not necessarily conductive FIGS. 8A and 8B also show the embodiment with a seed layer only on the bottom of the capacitor dielectric layer. However, the seed layer could be on the top also, or with no seed layers, as is true for all the embodiments shown herein.

FIG. 8B illustrates a view AA of the microelectronic device 800 having a package substrate with a package integrated ultra-high-k corrugated capacitor having electrodes formed in a single organic layer of the package substrate in accordance with one embodiment.

FIG. 9A illustrates a top view of a microelectronic device having a package substrate with an integrated ultra-high-k capacitor that is designed with an interdigitated configuration in accordance with one embodiment. The microelectronic device 900 includes a package substrate 950 having at least one ultra-high-k capacitor 920, dielectric material 902 (e.g., organic material, low temperature co-fired ceramic materials, liquid crystal polymers, etc.), and different levels of conductive layers and connections. The ultra-high-k capacitor 920 includes conductive interdigitated electrodes 912 and 914, and ultra-high-k dielectric layer 918 that may be disposed on an optional passivation material 913. In this configuration, the electrodes are patterned in the same horizontal layer in an interdigitated fashion. The capacitor 920 is embedded within the organic package substrate 950 and electrically routed with the standard conductive layers and connections in the package substrate. The ultra-high-k dielectric layers (e.g., ferroelectric material, ferroelectric perovskite, lead zirconate titanate (PZT), barium strontium titanate (BST), barium titanate (BTO), sodium potassium niobate (KNN), etc.) can be any material with permittivity high enough to achieve a capacitance density in the range of 10-10,000 nF/mm$^2$.

FIG. 9B illustrates a view AA' of the microelectronic device 900 having a package substrate with a package integrated ultra-high-k capacitor that is designed with an interdigitated configuration in accordance with one embodiment. FIGS. 9A and 9B show the embodiment without a seed layer. However, a seed layer could be included between electrode 912 and ultra-high-k dielectric material 918 and between electrode 914 and ultra-high-k dielectric material 918.

The package substrates and capacitors can have different thicknesses, length, and width dimensions in comparison to those disclosed and illustrated herein. In another embodiment, any of the devices or components can be coupled to each other.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 10:
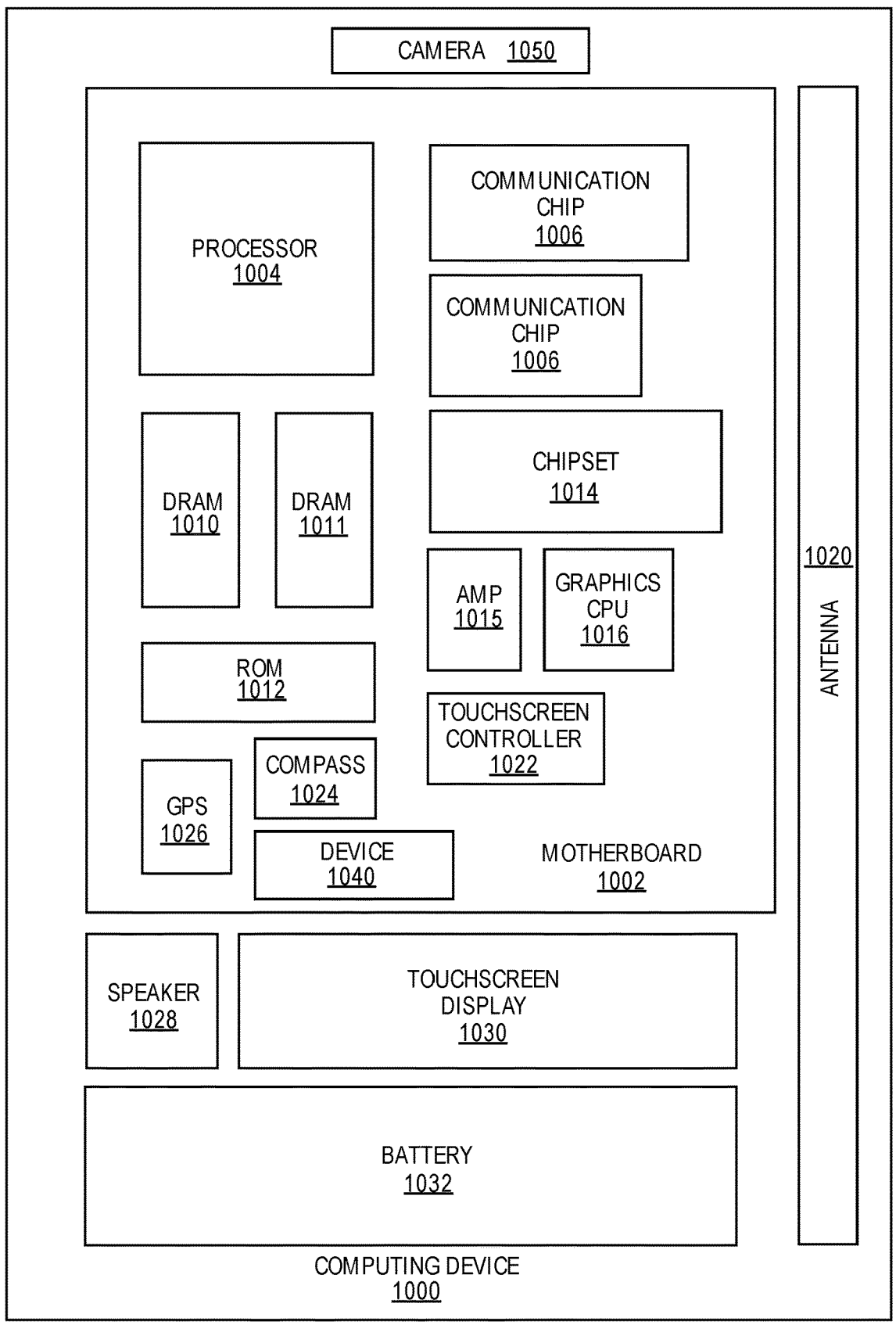
FIG. 10 illustrates a computing device 1000 in accordance with one embodiment.

FIG. 10 illustrates a computing device 1000 in accordance with one embodiment. The computing device 1000 houses a board 1002. The board (e.g., motherboard, printed circuit board, etc.) may include a number of components, including but not limited to at least one processor 1004 and at least one communication chip 1006. The at least one processor 1004 is physically and electrically coupled to the board 1002. In some implementations, the at least one communication chip 1006 is also physically and electrically coupled to the board 1002. In further implementations, the communication chip 1006 (e.g., microelectronic device 100, 200, 400, 500, 600, 800, 900, etc.) is part of the processor 1004.

Depending on its applications, computing device 1000 may include other components that may or may not be physically and electrically coupled to the board 1002. These other components include, but are not limited to, volatile memory (e.g., DRAM 1010, 1011), non-volatile memory (e.g., ROM 1012), flash memory, a graphics processor 1016, a digital signal processor, a crypto processor, a chipset 1014, an antenna unit 1020, a display, a touchscreen display 1030, a touchscreen controller 1022, a battery 1032, an audio codec, a video codec, a power amplifier 1015, a global positioning system (GPS) device 1026, a compass 1024, a gyroscope, a speaker, a camera 1050, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi, WiGig, and Bluetooth and a second communication chip 1006 may be dedicated to longer range wireless communications such as GPS, EDGE, GPRS, CDMA, WiMAX, LTE, Ev-DO, 5G, and others.

The at least one processor 1004 of the computing device 1000 includes an integrated circuit die packaged within the at least one processor 1004. In some embodiments of the invention, the processor package includes one or more devices, such as microelectronic devices (e.g., microelectronic device 100, 200, 400, 500, 600, 800, 900, etc.) having a package integrated ultra-high-k capacitor in accordance with implementations of embodiments of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of embodiments of the invention, the communication chip package includes one or more microelectronic devices (e.g., microelectronic device 100, 200, 300, 400, 500, 600, 800, 900, etc.) having package-integrated ultra-high-k capacitors.

The following examples pertain to further embodiments. Example 1 is a microelectronic device that includes a plurality of organic dielectric layers and an ultra-high-k dielectric capacitor formed in-situ with at least one organic dielectric layer of the plurality of organic dielectric layers. The ultra-high-k dielectric capacitor includes first and second conductive electrodes and an ultra-high-k dielectric layer that is positioned between the first and second conductive electrodes.

In example 2, the subject matter of example 1 can optionally include the ultra-high-k dielectric capacitor having a capacitance density of at least 10 nanoFarad per millimeter$^2$.

In example 3, the subject matter of any of examples 1-2 can optionally include the ultra-high-k dielectric layer having a relative permittivity of at least 200 up to 10,000.

In example 4, the subject matter of any of examples 1-3 can optionally include the ultra-high-k dielectric capacitor that further comprises a first seed layer that is disposed on the first conductive electrode and the ultra-high-k dielectric layer is disposed on the first seed layer.

In example 5, the subject matter of any of examples 1-4 can optionally include the first seed layer that comprises a conductive layer that is different than the first and second conductive electrodes or the first seed layer comprises a conductive oxide layer.

In example 6, the subject matter of any of examples 1-5 can optionally include the first seed layer that comprises a thermal buffer layer.

In example 7, the subject matter of any of examples 1-6 can optionally include the ultra-high-k dielectric capacitor that further comprises a second seed layer that is disposed on the ultra-high-k dielectric layer and the second conductive electrode is disposed on the second seed layer.

In example 8, the subject matter of any of examples 1-7 can optionally include the ultra-high-k dielectric capacitor that is formed in-situ with a single organic dielectric layer of the plurality of organic dielectric layers.

In example 9, the subject matter of any of examples 1-8 can optionally include each electrode of the ultra-high-k dielectric capacitor being formed in-situ with a different single organic dielectric layer of the plurality of organic dielectric layers.

In example 10, the subject matter of any of examples 1-9 can optionally include each electrode of the ultra-high-k dielectric capacitor being formed with an interdigitated configuration.

Example 11 is a microelectronic device that includes at least one organic dielectric layer of a package substrate and an ultra-high-k dielectric capacitor that is formed in-situ with the at least one organic dielectric layer of the package substrate. The ultra-high-k dielectric capacitor includes first and second conductive electrodes and an ultra-high-k dielectric layer that is positioned between the first and second conductive electrodes.

In example 12, the subject matter of example 11 can optionally include the ultra-high-k dielectric capacitor having a capacitance density of at least 10 nanoFarad per millimeter$^2$.

In example 13, the subject matter of any of examples 11-12 can optionally include the ultra-high-k dielectric layer having a relative permittivity of at least 200 up to 10,000.

In example 14, the subject matter of any of examples 11-13 can optionally include the ultra-high-k dielectric capacitor that further comprises a first seed layer that is disposed on the first conductive electrode that is disposed on the at least one organic dielectric layer In example 15, the subject matter of any of examples 11-14 can optionally include the ultra-high-k dielectric layer being disposed on the first seed layer.

In example 16, the subject matter of any of examples 11-15 can optionally include the first seed layer that comprises a conductive layer that is different than the first and second conductive electrodes.

In example 17, the subject matter of any of examples 11-16 can optionally include the ultra-high-k dielectric capacitor that further comprises a second seed layer that is disposed on the ultra-high-k dielectric layer and the second conductive electrode is disposed on the second seed layer.

Example 18 is a method to fabricate an ultra-high-k dielectric capacitor comprising forming a first capacitor electrode layer in-situ with an organic dielectric layer of a package substrate, sputtering a first seed layer on the first capacitor electrode layer, and sputtering an ultra-high-k dielectric layer on the first seed layer.

In example 19, the subject matter of example 18 can optionally include laser annealing the ultra-high-k dielectric layer in capacitor electrode regions to crystallize the ultra-high-k dielectric layer without damaging the organic dielectric layer of the package substrate.

In example 20, the subject matter of any of examples 18-20 can optionally include sputtering a second seed layer on the ultra-high-k dielectric layer and forming a conductive layer on the second seed layer.

In example 21, the subject matter of any of examples 18-20 can optionally include performing a lithographic operation and plating of a conductive layer in the capacitor electrode regions to form a second capacitor electrode and utilizing the second capacitor electrode as a hard mask for etching regions of the second seed layer, regions of the ultra-high-k dielectric layer, and regions of the first seed layer to form the ultra-high-k dielectric capacitor.

What is claimed is:

1. A microelectronic device comprising:
a plurality of organic dielectric layers; and
a capacitor formed within at least one organic dielectric layer of the plurality of organic dielectric layers, and the capacitor includes first and second conductive electrodes and an ultra-high-k dielectric layer that is positioned between the first and second conductive electrodes, wherein the capacitor further comprises a first seed layer that is disposed on the first conductive electrode and the ultra-high-k dielectric layer is disposed on the first seed layer, wherein the first seed layer comprises a conductive oxide layer.

2. The microelectronic device of claim 1, wherein the capacitor has a capacitance density of at least 10 nanoFarad per millimeter.

3. The microelectronic device of claim 1, wherein the ultra-high-k dielectric layer has a relative permittivity of at least 200 up to 10,000.

4. The microelectronic device of claim 1, wherein the capacitor further comprises a second seed layer that is disposed on the ultra-high-k dielectric layer and the second conductive electrode is disposed on the second seed layer.

5. The microelectronic device of claim 1, wherein the capacitor is formed within a single organic dielectric layer of the plurality of organic dielectric layers.

6. The microelectronic device of claim 1, wherein each electrode of the capacitor is formed within a different single organic dielectric layer of the plurality of organic dielectric layers.

7. The microelectronic device of claim 1, wherein each electrode of the capacitor is formed with an interdigitated configuration.

8. A microelectronic device comprising:
at least one organic dielectric layer of a package substrate; and
a capacitor that is formed within the at least one organic dielectric layer of the package substrate, and the capacitor includes first and second conductive electrodes and an ultra-high-k dielectric layer that is positioned between the first and second conductive electrodes, wherein the capacitor further comprises a first seed layer that is disposed on the first conductive electrode and the ultra-high-k dielectric layer is disposed on the first seed layer, wherein the first seed layer comprises a conductive oxide layer.

9. The microelectronic device of claim 8, wherein the capacitor has a capacitance density of at least 10 nanoFarad per millimeter$^2$.

10. The microelectronic device of claim 8, wherein the ultra-high-k dielectric layer has a relative permittivity of at least 200 up to 10,000.

11. The microelectronic device of claim 8, wherein the capacitor further comprises a second seed layer that is disposed on the ultra-high-k dielectric layer and the second conductive electrode is disposed on the second seed layer.

12. A method to fabricate a capacitor comprising:
forming a first capacitor electrode layer within an organic dielectric layer of a package substrate;
sputtering a first seed layer on the first capacitor electrode layer, wherein the first seed layer comprises a conductive oxide layer; and
sputtering an ultra-high-k dielectric layer on the first seed layer.

13. The method of claim 12, further comprising:
laser annealing the ultra-high-k dielectric layer in capacitor electrode regions to crystallize the ultra-high-k dielectric layer without damaging the organic dielectric layer of the package substrate.

14. The method of claim 13, further comprising:
sputtering a second seed layer on the ultra-high-k dielectric layer;
forming a conductive layer on the second seed layer.

15. The method of claim 14, further comprising:
performing a lithographic operation and plating of a conductive layer in the capacitor electrode regions to form a second capacitor electrode; and
utilizing the second capacitor electrode as a hard mask for etching regions of the second seed layer, regions of the ultra-high-k dielectric layer, and regions of the first seed layer to form the capacitor.

16. A microelectronic device comprising:
a plurality of organic dielectric layers; and a capacitor formed in-situ with at least one organic dielectric layer of the plurality of organic dielectric layers, and the capacitor includes first and second conductive electrodes and an ultra-high-k dielectric layer that is positioned between the first and second conductive electrodes, wherein the capacitor has a capacitance density of at least 10 nanoFarad per millimeter$^2$.

17. A microelectronic device comprising:

a plurality of organic dielectric layers; and a capacitor formed in-situ with at least one organic dielectric layer of the plurality of organic dielectric layers, and the capacitor includes first and second conductive electrodes and an ultra-high-k dielectric layer that is positioned between the first and second conductive electrodes, wherein the capacitor further comprises a first seed layer that is disposed on the first conductive electrode and the ultra-high-k dielectric layer is disposed on the first seed layer, wherein the first seed layer comprises a conductive layer that is different than the first and second conductive electrodes, and wherein the first seed layer comprises a thermal buffer layer.

18. The microelectronic device of claim 17, wherein the capacitor further comprises a second seed layer that is disposed on the ultra-high-k dielectric layer and the second conductive electrode is disposed on the second seed layer.

19. A microelectronic device comprising:

a plurality of organic dielectric layers; and a capacitor formed in-situ with at least one organic dielectric layer of the plurality of organic dielectric layers, and the capacitor includes first and second conductive electrodes and an ultra-high-k dielectric layer that is positioned between the first and second conductive electrodes, wherein each electrode of the capacitor is formed with an interdigitated configuration.

* * * * *